United States Patent
Tang et al.

(10) Patent No.: US 9,797,242 B2
(45) Date of Patent: Oct. 24, 2017

(54) TELEMETRY CODING AND SURFACE DETECTION FOR A MUD PULSER

(71) Applicant: Schlumberger Technology Corporation, Sugar Land, TX (US)

(72) Inventors: Caimu Tang, Sugar Land, TX (US); Mark S. Beattie, Katy, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 468 days.

(21) Appl. No.: 14/280,339

(22) Filed: May 16, 2014

(65) Prior Publication Data

US 2014/0254322 A1    Sep. 11, 2014

Related U.S. Application Data

(62) Division of application No. 12/512,222, filed on Jul. 30, 2009, now Pat. No. 8,730,764.

(51) Int. Cl.
| | |
|---|---|
| *E21B 47/18* | (2012.01) |
| *G01V 1/00* | (2006.01) |
| *H03M 7/08* | (2006.01) |
| *H03M 7/30* | (2006.01) |

(52) U.S. Cl.
CPC .............. *E21B 47/18* (2013.01); *G01V 1/003* (2013.01); *H03M 7/08* (2013.01); *H03M 7/30* (2013.01)

(58) Field of Classification Search
CPC ..................................................... E21B 47/18
See application file for complete search history.

(56) References Cited

U.S. PATENT DOCUMENTS

| | | |
|---|---|---|
| 3,991,611 A | 11/1976 | Marshall, III et al. |
| 4,797,668 A | 1/1989 | Zimmer |
| 4,808,996 A | 2/1989 | Zimmer |
| 4,908,804 A | 3/1990 | Rorden |
| 5,010,333 A | 4/1991 | Gardner et al. |
| 5,402,122 A | 3/1995 | Al-Ofi |
| 6,308,562 B1 | 10/2001 | Abdallah et al. |
| 6,421,298 B1 | 7/2002 | Beattie et al. |

(Continued)

FOREIGN PATENT DOCUMENTS

WO    2011014761 A2    2/2011

OTHER PUBLICATIONS

Hero, et al. "A new generalized cross correlator," IEEE Trans. Acoustics, Speech, and Signal Processing, vol. ASSP-33, No. 1, pp. 38-45, Feb. 1985.

(Continued)

*Primary Examiner* — Amine Benlagsir

(57) ABSTRACT

A method for receiving an encoded integer includes acquiring a digitized waveform including a first plurality of pulses distributed among a second plurality of time slots, locating each of the pulses in the digitized waveform, computing a confidence value for each of the pulses, selecting a subset of the plurality of pulses, the subset including pulses having low confidence values computed, generating a set of unique waveforms corresponding to various combinations of the subset of pulses selected, computing a cross-correlation between each of the waveforms generated and the digitized waveform acquired, and selecting the waveform having the highest cross-correlation computed.

7 Claims, 5 Drawing Sheets

(56) References Cited

U.S. PATENT DOCUMENTS

| | | |
|---|---|---|
| 7,400,276 B1 | 7/2008 | Sotiriadis et al. |
| 7,489,591 B2 | 2/2009 | Mumby |
| 7,583,209 B1 | 9/2009 | Duan |
| 8,730,764 B2 | 5/2014 | Tang et al. |
| 2004/0015766 A1 | 1/2004 | Toyama et al. |
| 2004/0113820 A1 | 6/2004 | Leanza |
| 2007/0036250 A1* | 2/2007 | Niedzwiecki ........ H04B 1/7105 375/348 |
| 2007/0188352 A1 | 8/2007 | Cheng |
| 2008/0219618 A1 | 9/2008 | McCarthy et al. |
| 2009/0150324 A1* | 6/2009 | Dhanekula ........... G06N 99/005 706/52 |
| 2011/0011594 A1 | 1/2011 | Young et al. |

OTHER PUBLICATIONS

Roth "Effective measurements using digital signal analysis," IEEE Spectrum, vol. 8, pp. 62-70, Apr. 1971.

* cited by examiner

| | F⁰ | F¹ | F² | F³ | F⁴ | F⁵ | F⁶ | F⁷ |
|---|---|---|---|---|---|---|---|---|
| 1 | 1 | 1 | 1 | 1 | 1 | 1 | 1 | 1 |
| 2 | 2 | 3 | 4 | 5 | 6 | 7 | 8 | 9 |
| 3 | 3 | 6 | 10 | 15 | 21 | 28 | 36 | 45 |
| 4 | 5 | 11 | 21 | 36 | 57 | 85 | 121 | 166 |
| 5 | 8 | 19 | 40 | 76 | 133 | 218 | 339 | 505 |
| 6 | 13 | 32 | 72 | 148 | 281 | 499 | 838 | 1,343 |
| 7 | 21 | 53 | 125 | 273 | 554 | 1,053 | 1,891 | 3,234 |
| 8 | 34 | 87 | 212 | 485 | 1,039 | 2,092 | 3,983 | 7,217 |
| 9 | 55 | 142 | 354 | 839 | 1,878 | 3,970 | 7,953 | 15,170 |
| 10 | 89 | 231 | 585 | 1,424 | 3,302 | 7,272 | 15,225 | 30,395 |
| 11 | 144 | 375 | 960 | 2,384 | 5,686 | 12,958 | 28,183 | 58,578 |
| 12 | 233 | 608 | 1,568 | 3,952 | 9,638 | 22,596 | 50,779 | 109,357 |
| 13 | 377 | 985 | 2,553 | 6,505 | 16,143 | 38,739 | 89,518 | 198,875 |
| 14 | 610 | 1,595 | 4,148 | 10,653 | 26,796 | 65,535 | 155,053 | 353,928 |
| 15 | 987 | 2,582 | 6,730 | 17,383 | 44,179 | 109,714 | 264,767 | 618,695 |
| 16 | 1,597 | 4,179 | 10,909 | 28,292 | 72,471 | 182,185 | 446,952 | 1,065,647 |
| 17 | 2,584 | 6,763 | 17,672 | 45,964 | 118,435 | 300,620 | 747,572 | 1,813,219 |
| 18 | 4,181 | 10,944 | 28,616 | 74,580 | 193,015 | 493,635 | 1,241,207 | 3,054,426 |
| 19 | 6,765 | 17,709 | 46,325 | 120,905 | 313,920 | 807,555 | 2,048,762 | 5,103,188 |

FIG. 4

TELEMETRY CODING AND SURFACE DETECTION FOR A MUD PULSER

RELATED APPLICATIONS

This application is a Divisional of, commonly-invented, and commonly-assigned U.S. patent application Ser. No. 12/512,222 (now U.S. Pat. No. 8,730,764) filed Jul. 30, 2009 and entitled Telemetry Coding and Surface Detection for a Mud Pulser, the contents of which are hereby incorporated for all purposes.

FIELD OF THE INVENTION

The present invention relates generally to data communication between a downhole tool deployed in a subterranean borehole and surface instrumentation. More particularly, this invention relates to downhole telemetry coding and surface detection and decoding of mud pulse telemetry.

BACKGROUND

Typical petroleum drilling operations employ a number of techniques to gather information about the borehole and the formation through which it is drilled. Such techniques are commonly referred to in the art as measurement while drilling (MWD) and logging while drilling (LWD). As used in the art, there is not always a clear distinction between the terms LWD and MWD. Generally speaking MWD typically refers to measurements taken for the purpose of drilling the well (e.g., navigation) and often includes information about the size, shape, and direction of the borehole. LWD typically refers to measurement taken for the purpose of analysis of the formation and surrounding borehole conditions and often includes various formation properties, such as acoustic velocity, density, and resistivity. It will be understood that the present invention is relevant to both MWD and LWD operations. As such they will be referred to commonly herein as "MWD/LWD."

Transmission of data from a downhole tool to the surface is a difficulty common to MWD/LWD operations. Mud pulse telemetry is one technique that is commonly utilized for such data transmissions. During a typical drilling operation, drilling fluid (commonly referred to as "mud" in the art) is pumped downward through the drill pipe, MWD/LWD tools, and the bottom hole assembly (BHA) where it emerges at or near the drill bit at the bottom of the borehole. The mud serves several purposes, including cooling and lubricating the drill bit, clearing cuttings away from the drill bit and transporting them to the surface, and stabilizing and sealing the formation(s) through which the borehole traverses. In a typical mud pulse telemetry operation, a transmission device, such as an electromechanical pulser or a mud siren located near the drill bit generates a series of pressure pulses (in which the data is encoded) that is transmitted through the mud column to the surface. At the surface, one or more transducers convert the pressure pulses to electrical signals, which are then transmitted to a signal processor. The signal processor then decodes the signals to provide the transmitted data to the drilling operator.

One significant difficulty with decoding a mud pulse signal is the poor signal to noise ratio that results from both low signal amplitude and high noise content. For example, the amplitude of a transmitted pressure pulse tends to attenuate as it travels up the drill pipe. Such attenuation is dependent on many factors including the depth of the borehole, the type of drilling mud, the hydrostatic pressure, the number of joints in the drill string, and the width of the pressure pulse. Moreover, there are a number of potential sources of noise generated during drilling operations including turning of the drill bit and/or drill pipe in the borehole, sliding and/or impact of the drill pipe against the borehole wall, and the mud pump that is used to pump the mud downhole.

Due in part to the poor signal to noise ratio, data transmission rates are slow (e.g., on the order of about 1 bit per second). Increasing the transmission rate tends to decrease the signal to noise ratio due to decreased signal amplitude. The low signal to noise ratio also tends to increase the frequency of transmission errors which can erode the reliability of the communication channel and disrupt the synchronization between the downhole encoder and the surface decoder. As is known to those of ordinary skill in the art, these problems can be severe in ordinary drilling operations, and in particular in deep wells.

U.S. Pat. No. 4,908,804 to Rorden discloses a combinatorial coding technique for mud pulse telemetry. While the methods disclosed in the Rorden patent have been commercially utilized, there remains room for further improvement. For example, there remains a need for coding and decoding methodologies that improve both the efficiency and reliability of mud pulse telemetry communications.

SUMMARY

The present invention addresses one or more of the above-described drawbacks of prior art data compression and communication techniques. Aspects of this invention include a method for encoding a non-negative integer. The integer may represent various downhole data, for example, including MWD/LWD data. The method includes encoding at least a portion of the integer using at least one novel Fibonacci derived sequence. The remainder of the integer may be encoded using conventional Fibonacci encoding. Surface detection and decoding methodologies are also disclosed.

Exemplary embodiments of the present invention may advantageously provide several technical advantages. For example, exemplary methods according to this invention tend to improve the encoding efficiency of large non-negative integers commonly utilized to represent downhole data. As such, the invention also tends to improve communication speed. Embodiments of the invention also tend to improve synchronization between the downhole and the surface locations, e.g., by the use of predefined word and window tags as described in more detail below. The inventive coding methodology also tends to result in coded bit sequences having sparsely spaced 1's. This advantageously facilitates pulse detection in MWD/LWD embodiments by reducing inter-pulse/inter-symbol interference. Downhole power savings may also be realized.

In one aspect the present invention includes a method for encoding a non-negative integer. After acquiring the integer, the method includes encoding at least a portion of the integer using at least a first order Fibonacci derived sequence to obtain a first encoded portion and encoding an uncoded remainder of the integer using a zero-th order Fibonacci sequence to obtain a second encoded portion. The method further includes combining the first encoded portion and the second encoded portion to obtain an encoded integer.

In another aspect, the present invention includes a method for transmitting downhole data to a surface location. The method includes acquiring a non-negative integer representative of the downhole data. At least a portion of the integer is then encoded using at least a first order Fibonacci derived sequence to obtain a first encoded portion. An uncoded remainder of the integer is encoded using a zero-th order Fibonacci sequence to obtain a second encoded portion. The first and second encoded portions are then combined to obtain an encoded integer, which is then transmitted to the surface.

In a further aspect, the present invention includes a method for receiving an encoded integer. The method comprises acquiring a digitized waveform including a first plurality of pulses distributed among a second plurality of time slots and locating each of the pulses in the digitized waveform. At least one confidence value is computed for each of the pulses. The method further includes selecting a subset of the plurality of pulses having low confidence values and generating a set of unique waveforms corresponding to various combinations of the selected subset of pulses. A cross-correlation between the acquired digitized waveform and each of the generated waveforms is then computed. The waveform having the highest cross-correlation is then selected for decoding.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 depicts an exemplary code matrix in accordance with the present invention including the conventional Fibonacci sequence and first through seventh order Fibonacci derived sequences.

DETAILED DESCRIPTION

Figure 1:
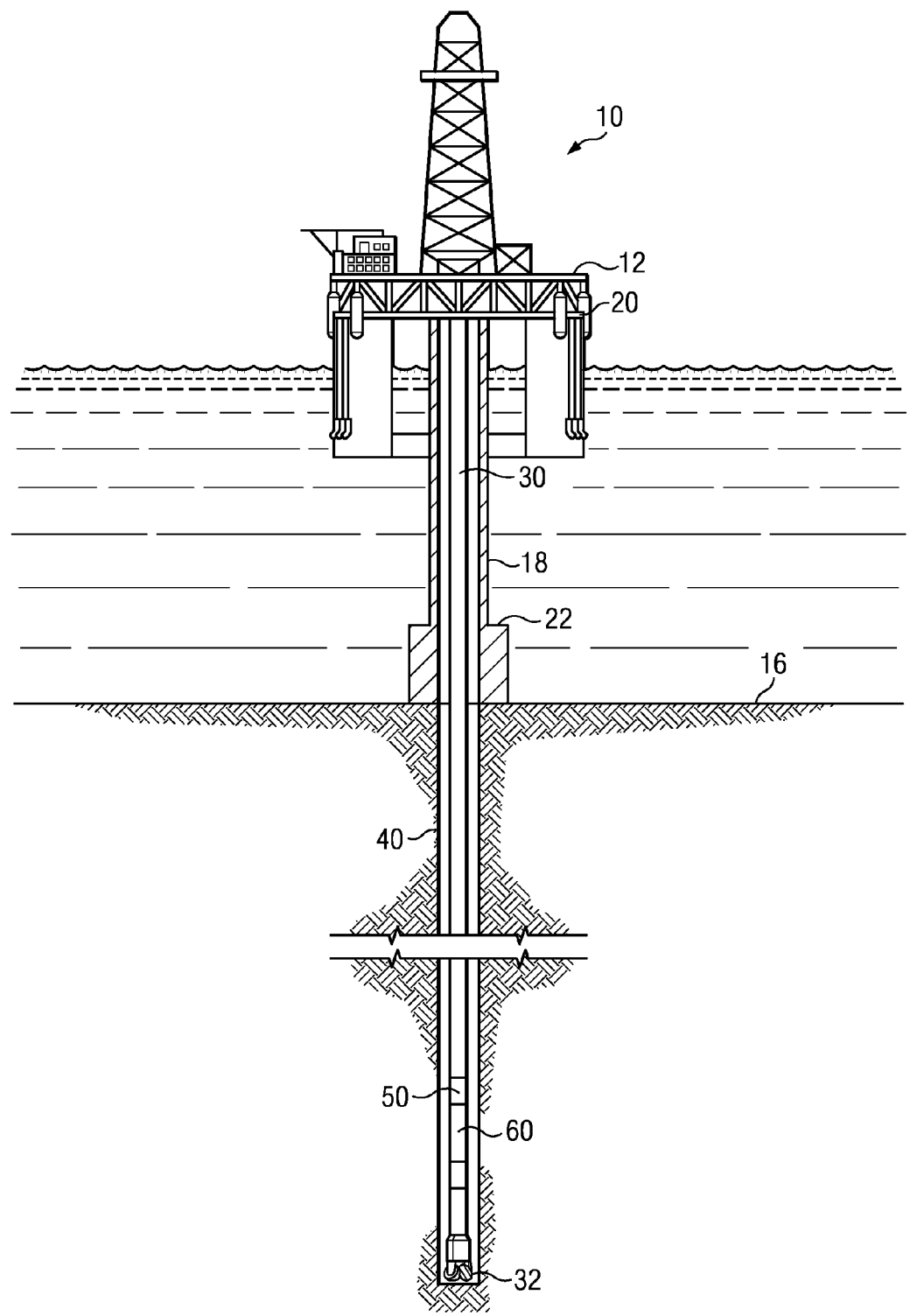
FIG. 1 depicts a conventional drilling rig on which exemplary embodiments of the present invention may be utilized.

FIG. 1 depicts an exemplary offshore drilling assembly, generally denoted 10, suitable for employing exemplary method embodiments in accordance with the present invention. In FIG. 1 a semisubmersible drilling platform 12 is positioned over an oil or gas formation (not shown) disposed below the sea floor 16. A subsea conduit 18 extends from deck 20 of platform 12 to a wellhead installation 22. The platform may include a derrick and a hoisting apparatus for raising and lowering the drill string 30, which, as shown, extends into borehole 40 and includes drill bit 32, a transmission device 50 (e.g., a conventional electromechanical pulser), and at least one MWD/LWD tool 60. Drill string 30 may optionally further include substantially any number of other tools including, for example, other MWD/LWD tools, stabilizers, a rotary steerable tool, and a downhole drilling motor.

It will be understood by those of ordinary skill in the art that the deployment illustrated on FIG. 1 is merely exemplary. It will be further understood that exemplary embodiments in accordance with the present invention are not limited to use with a semisubmersible platform 12 as illustrated on FIG. 1. The invention is equally well suited for use with any kind of subterranean drilling operation, either offshore or onshore. Moreover, it will further be appreciated that the invention is not limited mud-pulse telemetry operations or even to downhole applications.

Figure 2:
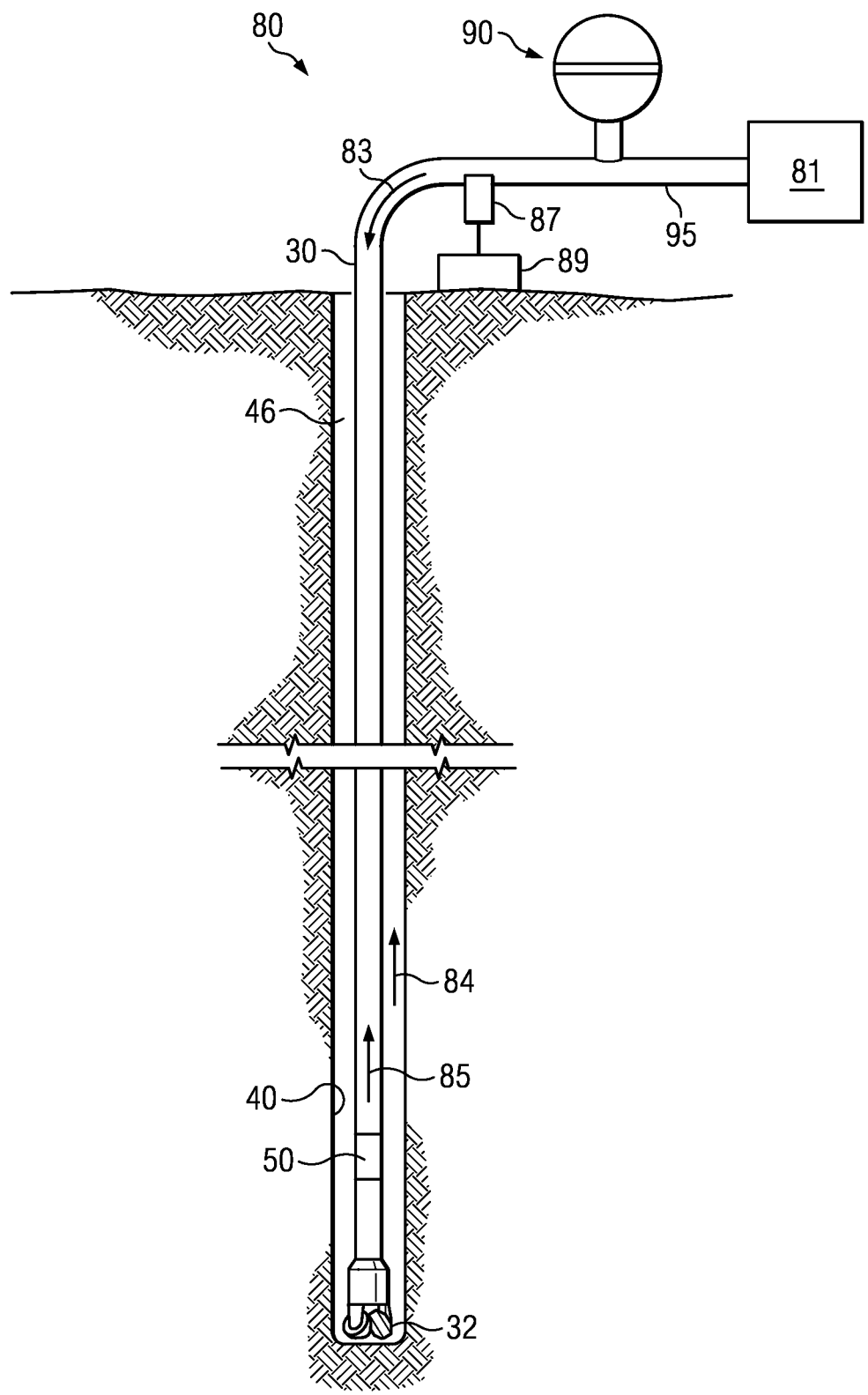
FIG. 2 depicts a conventional mud flow arrangement in which exemplary embodiments of the present invention may be utilized.

Referring now to FIG. 2, an exemplary prior art mud pulse telemetry apparatus 80 is illustrated. A mud pump 81 generates a downward traveling mud flow 83 into a standpipe 95 and down through drill string 30. Rotation of the drill string (and/or drill bit 32) creates borehole 40 in the earth (or in sea floor 16 as shown on FIG. 1). The mud flow 83 emerges at or near the drill bit 32 and creates an upward traveling mud flow 84 through annulus 46 (the space between the drill string 30 and the borehole wall). Conventional rigs commonly further include a pulsation dampener 90 (also referred to in the art as a desurger) that evens out the flow 83 in the standpipe 95 and drill string 30. The pulsation dampener 90 essentially acts like an accumulator to smooth outlet pressure generated by the mud pump 81.

MWD/LWD data is encoded downhole (e.g., via a conventional downhole controller). A transmission device 50, such as a conventional electromechanical mud pulser, produces an acoustic pressure wave 85 (a "waveform" that includes the encoded data). This pressure wave 85 travels towards the surface at approximately the speed of sound (typically in the range of about 2000 to 4000 feet per second) through the downward traveling mud 83. It will be appreciated that the signal may also be transmitted through and received from the upward traveling mud flow 84 in the annulus 46.

The transmitted pressure wave 85 may be received (detected) at transducer 87 and decoded and analyzed via signal processor 89 (for example a conventional data acquisition computer or DSP board). Substantially any suitable transducer arrangement may be utilized. For example, the use of a single transducer, as depicted on FIG. 2 is common in the art. Multiple transducer arrangements are also known, for example, as disclosed in U.S. Pat. No. 6,421,298 to Beattie et al. A differential transducer arrangement may also be utilized. One such suitable arrangement is disclosed in commonly assigned U.S. Pat. No. 7,489,591 to Mumby.

Methods in accordance with the present invention pertain to downhole encoding and surface decoding of the MWD/LWD data. Methods in accordance with the present invention also relate to windowing methodology for synchronizing the downhole encoder with the surface decoder and a matched filtering detection scheme for reconstructing the transmitted bit sequence. These methods are described in more detail below under appropriate headings.

Figure 3:
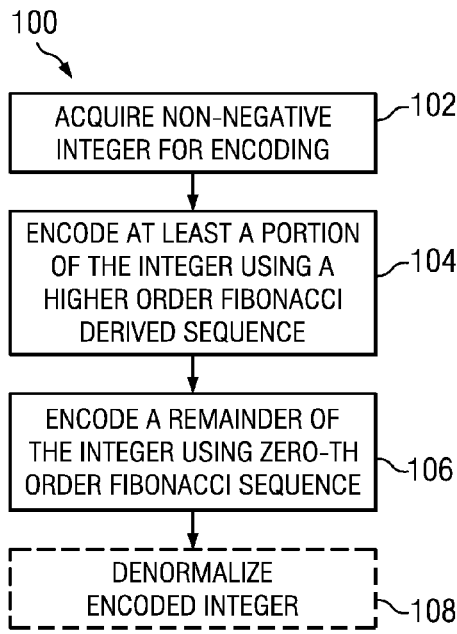
FIG. 3 depicts a flowchart of one exemplary data encoding embodiment in accordance with the present invention.

Turning now to FIG. 3, one exemplary embodiment of an encoding methodology 100 in accordance with the present invention is depicted in flow chart form. At 102, a non-negative integer suitable for encoding is received. At 104 at least a portion of the non-negative integer is encoded using one or more novel higher order Fibonacci derived sequences. These novel Fibonacci derived sequences are described in more detail below with respect to FIG. 4. A remainder of the non-negative integer is encoded using a conventional (zero-th order) Fibonacci sequence at 106. The encoded bit stream may optionally be denormalized at 108 prior to transmission.

Fibonacci Encoding and Decoding

As described above with respect to FIG. 3, encoding schemes in accordance with the present invention make use of both the conventional Fibonacci sequence and novel Fibonacci derived sequences. The first 19 elements of certain of these sequences are depicted on FIG. 4, with column $F^0$ depicting the conventional Fibonacci sequence (which may be thought of as a zero-th order Fibonacci derived sequence) and columns $F^1$ through $F^7$ depicting first through seventh order Fibonacci derived sequences. As is known to those of skill in the mathematical arts, the conventional Fibonacci sequence may be represented mathematically as follows:

$$F^0(i)=F^0(i-1)+F^0(i-2) \qquad \text{Equation 1}$$

where $F^0(i)$ represents the i-th element of the Fibonacci sequence such that $i \geq 3$ and $F^0(1)=1$ and $F^0(2)=2$. The novel Fibonacci derived sequences may be represented mathematically as follows:

$$F^k(j)=F^k(j-1)+F^{k-1}(j) \qquad \text{Equation 2}$$

where $F^k(j)$ represents the j-th element of the k-th order Fibonacci derived sequence such that $j \geq 2$ and $k \geq 1$ and $F^k(1)=1$. As is evident from Equation 2, the higher order Fibonacci derived sequences may be thought of as being derived from the conventional Fibonacci sequence. For example, the first order Fibonacci derived sequence may be derived from the conventional Fibonacci sequence (the zero-th order sequence). The second order Fibonacci derived sequence may be derived from the first order sequence (which may be derived from the conventional sequence). And so on.

The Fibonacci derived sequences may be represented in alternative mathematical form as follows:

$$F^k(j)=F^k(j-1)+F^k(j-2)+2; \ k=1$$

$$F^k(j)=F^k(j-1)+F^k(j-2)+B^{k-1}(j); \ k>1 \qquad \text{Equation 3}$$

where B represents an auxiliary arithmetic sequence given as follows

| $B^1$ | $B^2$ | $B^3$ | $B^4$ | $B^5$ | ... | Equation 4 |
|---|---|---|---|---|---|---|
| 1 | 1 | 1 | 1 | 1 | | |
| 3 | 4 | 5 | 6 | 7 | | |
| 5 | 9 | 14 | 20 | 27 | | |
| 7 | 16 | 30 | 50 | 77 | | |
| 9 | 25 | 55 | 105 | 182 | | |
| ⋮ | | | | ⋱ | | | where column $B^1$ is an arithmetic sequence with constant 2 of order 1. Column $B^2$ may be thought of as being an arithmetic sequence with constant 2 of order 2, since $B^2(j)-B^2(j-1)=B^1(j)$. Column $B^3$ may be thought of as being an arithmetic sequence with constant 2 of order 3 since $B^3(j)-B^3(j-1)=B^2(j)$. And so on.

The above defined Fibonacci sequence and Fibonacci derived sequences may be advantageously used in accordance with the present invention to encode any non-negative integer. Those of skill in the mathematical and signal processing arts will recognize that any non-negative integer x may be encoded using the conventional Fibonacci sequence (i.e., column $F^0$ in FIG. 4). Zeckendorf's theorem states that every positive integer can be represented in a unique way as the sum of one or more distinct Fibonacci numbers in such a way that the sum does not include any two consecutive Fibonacci numbers. A suitable algorithm for such Fibonacci encoding may be given in Algorithm I as follows:

Step (1): Initialize $\overline{F^0(x)}$ to 0.

Step (2): Search $F^0$ for the biggest element smaller than x (the i-th element where i=0 for x=0) and then set the (i+2)-th bit and the (i+1)-th bit of $\overline{F^0(x)}$ to 1. Also, set $x=x-F^0(i)$.

Step (3): Repeat the following steps until x=0: (a) search $F^0$ for the biggest element smaller than x (the j-th element), (b) set the (j+1)-th bit of $\overline{F^0(x)}$ to 1, and (c) set $x=x-F^0(j)$.

Step (4): Output bits from the least significant bit (LSB) to the most significant bit (MSB) of the encoded value.

Such Fibonacci encoding is advantageous in that any non-negative integer may be encoded without the use of consecutive 1s. As a result, the string '11' only appears at the end of an encoded integer and therefore serves as a separator between two consecutively encoded integers. To decode a bit sequence generated by Algorithm I, a controller merely searches for the next '11' and decodes the bit stream between consecutive '11' strings.

While conventional Fibonacci encoding may provide for self-synchronization, it tends to be somewhat inefficient in encoding the large integer values that are commonly utilized to encode various MWD/LWD data. Given the severe bandwidth constraints of conventional mud pulse telemetry, efficiency improvements are desired.

Non-negative integers (particularly large integers) may be more efficiently encoded in accordance with the present invention using the Fibonacci derived sequences (i.e., the higher order Fibonacci sequences described above) while still retaining the advantages of Fibonacci encoding. A suitable algorithm, in accordance with the present invention, for such derived Fibonacci encoding (also referred to herein as higher order Fibonacci encoding) may be given in Algorithm II as follows:

Step (1): Initialize $\overline{F^n(x)}$ to 0.

Step (2): Execute the following steps iteratively from $F^n$ to $F^1$: (a) search in $F^k (1 \leq k \leq n)$ for the biggest element smaller than x (the $k_i$-th element where $k_i=0$ for x=0), (b) set the $(k_i+k+2)$-th bit of $\overline{F^n(x)}$ to 1, and (c) set $x=x-F^k(k_i)$.

Step (3): Apply Algorithm 1 to the remainder of x after the completion of Step 2 and set these $k_1+2$ least significant bits of $\overline{F^n(x)}$. Note that this step is performed even when the remainder of x is zero after Step (2).

Step (4): Output bits from the LSB to the MSB of the encoded value.

The above-described derived Fibonacci encoding method in accordance with the present invention may be utilized to encode any non-negative integer for any given order: $n \geq 1$. Moreover, such derived Fibonacci encoding retains the self-synchronization feature of conventional Fibonacci encoding in which each integer is identified by the string '11'. However, unlike conventional Fibonacci encoding, the string '11' is located in the middle of the encoded integer, between a first portion of the integer that is encoded in Step (2) and a second portion of the integer encoded in Step (3).

With reference again to FIGS. 3 and 4, this coding methodology is now described in more detail by way of example. The Fibonacci derived sequences may be thought of as being a code matrix in which each higher order sequence $F^k$ ($0 \leq k \leq n$) represents a single column in the matrix. The encoding process begins at a predetermined $F^n$ (e.g., n=4 and n=7 in the examples that follow) and proceeds from right to left selecting exactly one value of $F^k(k_i)$ from each column. A '1' is recorded in the ($k_i$+k+2)-th bit of $\overline{F^n(x)}$ for each selected $F^k(k_i)$. Upon reaching column $F^0$, the remainder of x is encoded using Algorithm I. Using this methodology, the positive integer 194,559 is now encoded, first for n=4 and then for n=7.

When n=4, the value 193,015 is selected from column $F^4$ (row 18), the value 1424 is selected from column $F^3$ (row 10), the value 72 is selected from column $F^2$ (row 6), and the value 32 is selected from column $F^1$ (row 6), leaving a remainder of 16. This results in the following bit stream: '1000000001000011' for columns $F^4$ through $F^1$. The remaining 16 may then be encoded as '11001000' via conventional Fibonacci encoding (selecting the values of 13 and 3 in rows 6 and 3 of column $F^0$). Combining the results from columns $F^4$ through $F^1$ and column $F^0$ yields: '100000000100001111001000'. In this example, the integer 194,559 is encoded using seven pulses distributed among 24 bits.

When n=7, the value 109,357 is selected from column $F^7$ (row 12), the value 50,779 is selected from column $F^6$ (row 12), the value 22,596 is selected from column $F^5$ (row 12), the value 9,638 is selected from column $F^4$ (row 12), the value 1424 is selected from column $F^3$ (row 10), the value 585 is selected from column $F^2$ (row 10), the value 142 is selected from column $F^1$ (row 9), leaving a remainder of 38. This results in the following bit stream: '1111001101' for columns $F^7$ through $F^1$. The remaining 38 may then be encoded as '1100001010' via conventional Fibonacci encoding (selecting the values of 34, 3, and 1 in rows 8, 3, and 1 of column $F^0$). Combining the results from columns $F^7$ through $F^1$ and column $F^0$ yields: '111100110101100001010'. Note that a single '0' was introduced between these results since the value selected in $F^1$ (142) is one row below the highest value selected in $F^0$ (row 9 vs. row 8). In this example, the integer 194,559 is encoded using eleven pulses distributed among 21 bits.

When encoded using conventional Fibonacci encoding, the integer 194,559 requires ten pulses distributed among 27 bits ('110101010010100010010010000'). The above examples illustrate potential efficiency improvements that may be realized using the derived Fibonacci encoding scheme of the present invention. In this example a savings of 6 bits was realized when n=7 at the expense of only one additional pulse. A savings of 3 bits and 3 pulses was realized when n=4. These pulse savings can significantly improve efficiency depending upon the particular de-normalization scheme utilized (as described in more detail below) and accuracy (depending on the particular surface detection algorithm utilized). A pulse savings also tends to save energy downhole at the MOP (in mud pulse telemetry embodiments). In practice, the use of higher order derived Fibonacci sequences (e.g., n=7 as opposed to n=4) often enables an integer (particular a large integer) to be encoded using fewer bits, however, the use of fewer bits sometimes comes at the expense of requiring additional pulses (as illustrated in the example given above). It will thus be appreciated that there is often a tradeoff between reducing the number of required bits versus reducing the number of required pulses when selecting a particular coding matrix via changing the allowable Fibonacci derived sequence order (note that, for an order n, the coding matrix is unique). It will also be appreciated that the invention is not limited to the use of a coding matrix having any particular number of columns or any particular number of higher order Fibonacci derived sequences. In practice, the coding matrix may be preselected so as to optimize efficiency for a given set (or range) of non-negative integers.

Non-negative integers encoded using the methodology described above in Algorithm II may be readily decoded. A suitable methodology for such derived Fibonacci decoding may be given in Algorithm III as follows:

Step (1): Search for the first '11'

Step (2): Initialize x to 0.

Step (3): Record the positions of each of the n '1' bits after the first '11'. Then decode for the value of each '1' using the corresponding $F^k$ ($1 \leq k \leq n$) and add values to x.

Step (4): Remove the second '1' from the first '11' and record the positions of each '1' before the first '11' (including the first '1' in the first '11'). Then decode for the value of each '1' using $F^0$ and add values to x.

Step (5): Search for next '11' to decode successive integers and repeat steps (2), (3), and (4).

Note that the number of bits used to encode any given non-negative integer is unknown at the decoder prior to decoding. Note also that the number of '1' bits between the '11' identifier in successively encoded integers must be greater than or equal to n. This is guaranteed by the encoding methodology.

By way of example, the previously encoded integer 194,559, encoded above using n=4 higher order Fibonacci derived sequences, is now decoded using Algorithm III. At step (1), the first '11' is identified (moving from right to left), as underlined in the encoded bit stream: '10000000010000<u>11</u>001000'. Each of the (n=4) '1' bits following the '11' identifier is assigned a value in step (3) based on its position after (to the left of) the underlined '11'. These values are then added to x. The values added to x in this example are 193,015 (selected from column $F^4$), 1424 ($F^3$), 72 ($F^2$), and 32 ($F^1$). At step (4), the string '1001000' (which remains after the second '1' is dropped from the underlined '11') is decoded using $F^0$ and the appropriate value (16) is added to x. The resultant integer is 194,559.

In order to output a bit sequence generated by Algorithm II to the telemetry channel (the column of drilling fluid), a pressure pulse or a specifically modulated waveform may be generated for each '1' in the bit sequence. Each '0' may be represented by an idle time slot of predetermined duration or a differently modulated waveform. In practical applications, pulses are advantageously separated in time by a sufficiently long duration to accommodate the extremely noise communication channel, (or for bits going through a modulation scheme, bit symbols can be advantageously separated by the difference of phase (and/or amplitude, frequency) offsets in a continuous waveform). Such separation may optionally be accomplished by a denormalization process (step 108 in FIG. 3) in which additional slots (or 0's) are added between pulses. For example, when using a mud operated pulser, the following denormalization process may be advantageously utilized in combination with Algorithm II.

In this example, Q represents the number of idle slots used to separate two consecutive pulses. As described above, the coded bit sequence generated by Algorithm II includes first and second coded portions that come after (to the left of) and before (to the right of) the '11' identifier. Each portion includes at least one pulse (at least one '1'). Since the '1' bits in the second portion (encoded using $F^0$) are already separated by at least one idle slot (at least one '0'), it is sufficient to insert Q–1 idle slots either before or after each pulse. In the first portion (encoded using $F^k$), the '1' bits are not necessarily separated, so Q idle slots may be inserted either before or after each pulse. The two '1' bits in the '11' identifier may be separated by Q–1 idle slots so as to create a unique (and therefore recognizable) pattern. In one advantageous implementation a word tag (the denormalized '11' identifier) may be defined as being 3Q–1 denormalized slots: Q–1 idle slots between the pulses in the '11' pattern and Q–1 leading idle slots and Q–1 trailing idle slots. In practice this word tag is often easier to identify during surface detection than an individual pulse (e.g., using a matched filtering algorithm as described in more detail below). A suitable denormalization process may be given in Algorithm IV as follows:

Step (1): Convert a bit sequence to a normalized slot sequence by a one-to-one mapping in which '1' is a pulse slot and '0' is an idle slot.

Step (2): Insert Q–1 idle slots immediately before each '1' before '11'.

Step (3): Insert Q–1 idle slots immediately before and immediately after the first '1' in '11'.

Step (4): Insert Q idle slots immediately before each of the '1' slots (those after '11'). After step (4), the output is ready for pulsing.

By way of example, the previously encoded integer 194,559, encoded above using n=4 higher order Fibonacci derived sequences, is now denormalized using Algorithm IV. In this example a denormalization constant Q=3 is used. The invention is, of course, not limited to the use of any particular denormalization constant or even to the use of denormalization. At step (2) Q–1 idle slots are inserted as indicated (the inserted slots are underlined): '10000000010000111100100000'. At step (3) Q–1 idle slots are inserted before and after the first '1' in the '11' to obtain: '100000000100001110010000100000'. At step (4) Q idle slots are then inserted before each '1' after the '11' as follows: '100000000001000000100010001001000100000'. In this exemplary denormalized string, the word tag is identified as: '00100100'.

Slot Sequencing Windowing

It will be appreciated that in exemplary embodiments of the above described encoding methodology the '11' identifier establishes synchronization between the surface and downhole systems. Given the noisy communication channel, there is some likelihood that the '11' identifier may be falsely received at the service or that a transmitted '11' may degrade to a single pulse. In such instances, successively encoded integers may be decoded in error, especially when successive integers are encoded using varying values of n. In exemplary embodiments of the present invention, these types of synchronization losses may be resolved in a cost effective manner using a windowing technique.

In such embodiments a window is defined to include a fixed number of non-negative integers. The window is typically preceded (or followed) by a window tag as described in more detail below. While such a window may include substantially any number of integers, it preferably includes enough integers so that the overhead associated with the window tag does not significantly degrade transmissions efficiency, but not so many integers as to require an excessively long time to resynchronize in the event of a missed or falsely received '11' identifier. Mud pulse telemetry embodiments may advantageously include a window length, for example, in a range from about 10 to about 50 integers. The invention is, of course, not limited in these regards. Nor is the invention limited to the use of a window tag. Such an implementation is purely optional.

In one exemplary embodiment in accordance with the present invention, a window tag may include the normalized string '111'. When denormalized, the window tag may advantageously include three pulses distributed in 4Q–1 slots. For example, one advantageous window tag includes Q–1 idle slots before the first pulse, Q–1 idle slots between the first and second pulses, Q–1 idle slots between the second and third pulses, and Q–1 idle slots after the third pulse. Between successive windows, the window tag may be advantageously combined with one of the above described word tags since the slot sequence for a word tag has a common prefix and the same number of idle slots between pulses as long as there are at least Q idle slots before the very first pulse of a number which is to ensure the window tag uniqueness. Such a scheme advantageously reduces overhead. Again, the invention is expressly not limited in these regards.

Surface Detection and Matched Filtering

Proper signal detection is critical to any communication system. Proper signal detection at the surface prior to decoding is especially important in mud pulse telemetry operations, in part due to the extremely noisy communication channel. Signal attenuation and drilling noise (as well as other sources of noise) can cause reception errors and a loss of synchronization between the downhole encoder and the surface decoder. The frequency of these errors may be reduced via surface detection and decoding techniques.

Figure 5:
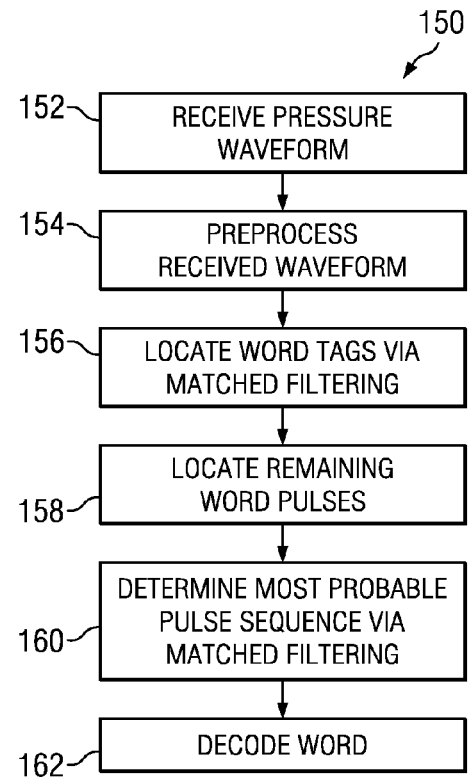
FIG. 5 depicts a flowchart of one exemplary embodiment of a surface detection methodology in accordance with the present invention.

Turning now to FIG. 5, one exemplary embodiment of a surface detection methodology 150 in accordance with the present invention is depicted in flow chart form. Surface detection, as the name implies, includes detecting (or receiving) the signal (in this case an analog pressure waveform) at the surface (152). The analog waveform may be received at the surface using substantially any suitable transducer or differential transducer arrangement, e.g., as disclosed in U.S. Pat. Nos. 6,421,298 and 7,489,591. The waveform is typically also preprocessed at 154. Conventional preprocessing may include, for example, digitizing and filtering the waveform (e.g., using analog to digital conversion and filtering or decimation routines). The surface detection method further includes a first matched filtering step at 156 in which the individual word tags (e.g., the 3Q–1 bits described above) are identified thereby enabling the waveform to be further processed word by word (i.e., integer by integer). This matched filtering step may alternatively be configured to identify individual window tags (e.g., the 4Q–1 bits described above) to enable further processing window by window (i.e., one group of integers). While the invention is described in more detail below in terms of a word by word algorithm, it will be appreciated the invention is not limited in these regards as this processing may be accomplished two, three, or more words (or windows) at a time.

With continued reference to FIG. 5, the pulses in a given word (or words) may be identified and located preliminarily at 158, for example, via setting a pulse threshold. At 160, the word may be further processed using a second matched filtering step as described in more detail below with respect to FIG. 7. The word (the encoded integer) may then be decoded at 162, for example as described above. The decoded integer may then be saved and/or plotted as is conventional in the art. Method steps 156, 158, and 160 are now described in more detail, beginning with the first matched filter step performed at 156.

Figure 6:
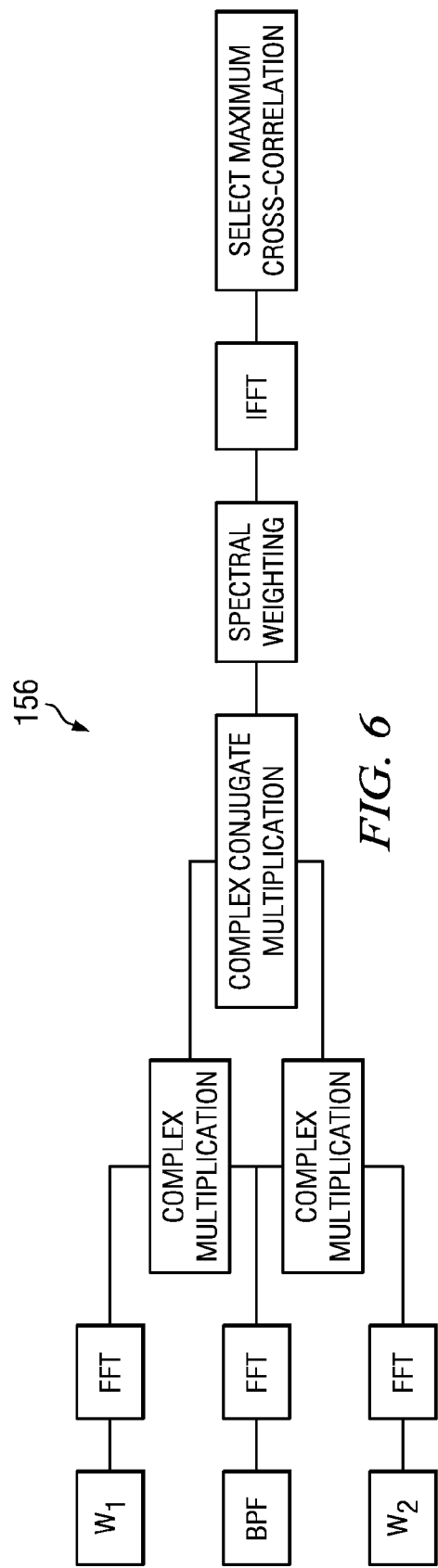
FIG. 6 depicts a flowchart of one exemplary embodiment of a matched filtering methodology in accordance with the present invention.

One exemplary embodiment of matched filtering step 156 is depicted in flow chart form on FIG. 6. This implementation includes a cross correlation methodology that may be represented mathematically, for example, as follows:

$$R_{12}(t) = \int_{-\infty}^{\infty} G_{12}(\omega) e^{j\omega t} d\omega \qquad \text{Equation 5}$$

where $R_{12}(t)$ represents the cross correlation of the two waveforms, $G_{12}(\omega)$ represents the cross spectrum of the two waveforms $w_1$ and $w_2$ and is defined as $H_1(\omega)H^*_2(\omega)$, where $H_1(\omega)$ is the Fourier Transform of $w_1$ and $H^*_2(\omega)$ is the complex conjugate of the Fourier Transform of $w_2$. In step 156 (FIG. 5), $w_1$ represents a portion of the decimated waveform including at least one word and $w_2$ represents a theoretical waveform for the word tag. The exemplary matched filtering routine depicted also includes a bandpass filtering (BPF) operations by which the DC component of the waveform $w_1$ may be removed.

With continued reference to FIG. 6, fast Fourier Transform (FFT) coefficients are computed for $w_1$, $w_2$, and the bandpass filter coefficients (BPF). The bandpass filter FFT coefficients are then multiplied (complex multiplication) with each of the $w_1$ and $w_2$ FFT coefficients. The resultant products are then processed via a complex conjugate multiplication operation as depicted and spectral weighted using a kernel such as a Roth processor or a Wiener processor. The real and imaginary parts of the spectral weighting process may be represented mathematically, for example, as follows:

$$(f_r^2(k)+f_i^2(k))(r_r(k)s_r(k)+s_i(k)r_i(k))$$

$$(f_r^2(k)+f_i^2(k))(r_i(k)s_r(k)-s_i(k)r_r(k)) \qquad \text{Equation 6}$$

where $s_r(k)+s_i(k)j$ represent the FFT coefficients of $w_1$, $r_r(k)+r_i(k)j$ represent the FFT coefficients of $w_2$, $f_r(k)+f_i(k)j$ represent the FFT coefficients of the impulse response of the bandpass filter, and ($0 \leq k \leq L-1$) with L being the sample length of waveform $w_1$. After spectral weighting, an inverse FFT (IFFT) may be applied to inverse transform the spectrally weighted result back into the time domain. The word tag (or tags) or window tag (or tags) may be identified where the cross correlation is a maximum (or greater than a predetermined threshold).

Individual words (identified as described above) may be further processed as depicted at 158, 160, and 162 in FIG. 5. For example, at 158 the other pulses in the word (the encoded integer) are located. This may be accomplished for example, via evaluating the pulse height of the pulses in the word tag located in 156 and applying a corresponding threshold (e.g., half the pulse height) to the waveform. Once the pulses have been identified and located (the output of step 158), the word may optionally be decoded at 162, for example as described above, in order to obtain the encoded and transmitted integer. While such an approach may be serviceable, a degree of uncertainty remains. In particular, due to the attenuation and noise in the communication channel, pulses are sometimes shifted in time. It is not uncommon for one or more pulses to be located, for example, between adjacent slots.

Figure 7:
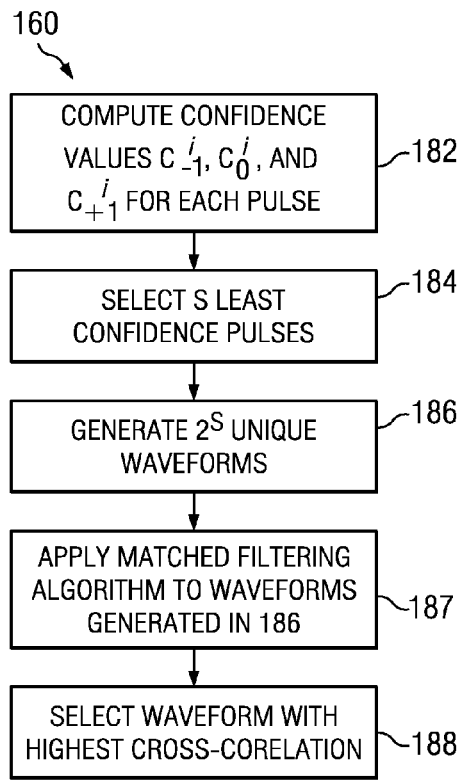
FIG. 7 depicts a flowchart of a selective matched filtering methodology in accordance with the present invention.

In one exemplary embodiment of the invention, the certainty of the detected word may be improved via applying a second matched filtering (cross-correlation) algorithm at 160. With reference now to FIG. 7, confidence values $C_0^i$, $C_{-1}^i$, and $C_{+1}^i$ may be computed for each pulse at 182. $C_0^i$ represent the confidence values for the i'th pulse as located in the slot in which it was detected (having a slot offset of 0). $C_{-1}^i$ and $C_{+1}^i$ represent the confidence values for the i'th pulse offset one slot earlier (−1) or later (+1) in time. The confidence values $C_0^i$, $C_{-1}^i$, and $C_{+1}^i$ may be computed, for example, via considering the noise to signal ratio (NSR) and the relative offset of each peak from a slot center position. The greater the NSR and the relative offset, the lower the confidence value. Confidence values may also be obtained via comparing the low pass filtered signal obtained in 154 with the bandpass filtered signal obtained in 156. A good peak-to-peak match indicates a high confidence value while a poor peak-to-peak match indicates a low confidence value.

Given that each pulse may be theoretically located in one of three slots, there are a total of $3^M$ combinations for a given word (where M represents the number of pulses in the word). Each of the $3^M$ combinations represents a unique potential waveform. In order to obtain the most likely waveform, each of these potential waveforms may be cross correlated with the decimated waveform $w_1$ using the matched filtering technique described above with respect to FIG. 6. The waveform with the highest amplitude may be taken as correct. While this approach may be suitable for certain applications, those of ordinary skill will readily appreciate that it is not tractable for even a moderate number of pulses M (e.g., there are 2187 potential waveforms for a word having only 7 pulses).

With continued reference to FIG. 7, a certain number S of least confident pulses may be selected at 184. The selected pulses have the lowest valued confidence values $C_0^i$. For example, only pulses having a confidence value less than some predetermined threshold may be selected. Alternatively, a fixed number of pulses (e.g., five) having the lowest valued confidence values may be selected. In practice, S is preferably a small number (e.g., about 5) such that the algorithm may be efficiently implemented on a conventional DSP chip such as a TI TMS320C6701. For each of the S least confident pulses, the more likely offset may also selected based on the values of $C_{-1}^i$ and $C_{+1}^i$. This results in $2^S$ unique combinations for S least confidence pulses. A selective matched detection algorithm in accordance with the present invention may be given, for example, in Algorithm V as follows:

Step (1): Seek S pulses having indices $\{S_i|1 \leq i \leq S\}$ which correspond to S least confidence values in $\{C_0^i|1 \leq i \leq M\}$.

Step (2): For each pulse in $\{S_i|1 \leq i \leq s\}$, select the offset '−1' when $C_{-1}^{Si} > C_{+1}^{Si}$ or '+1' when $C_{+1}^{Si} \geq C_{-1}^{Si}$. Steps (1) and (2) may be executed at 184 in FIG. 7

Step (3): Generate a $2^S$ unique waveforms at 186 based on the $2^S$ combinations of $\{S_i|1 \leq i \leq S\}$ and the M−S pulses (the "most confident pulses") that have fixed positions.

Step (4): Apply the matched filtering algorithm depicted in FIG. 6 at 187 to each of the waveforms generated in Step (3).

Step (5): Select the wave form having the highest cross-correlation with the reference waveform (the decimated waveform) at 188.

Although the present invention and its advantages have been described in detail, it should be understood that various changes, substitutions and alternations can be made herein without departing from the spirit and scope of the invention as defined by the appended claims.

We claim:

1. A method for receiving a mud pulse telemetry signal at a surface location, an encoded integer, the method comprising:
   (a) receiving an analog pressure waveform at the surface location;
   (b) digitizing the analog pressure waveform to obtain acquiring a digitized waveform including a first plurality of pulses distributed among a second plurality of time slots;
   (c) locating each of the pulses of the first plurality of pulses in the digitized waveform;
   (d) computing a confidence value for said each of the pulses of the first plurality of pulses;
   (e) selecting a subset of the first plurality of pulses, the subset including pulses having low confidence values computed in (d);
   (f) generating a set of unique waveforms from the digitized waveform, the set of unique waveforms corresponding to various combinations of the subset of the first plurality pulses selected in (e);
   (g) computing corresponding cross-correlations between each of the unique waveforms generated in (f) and the digitized waveform acquired in (b); and
   (h) selecting a second waveform of the unique waveforms generated in (f) having the highest cross-correlation computed in (g).

2. The method of claim 1, further comprising:
   (i) decoding the second waveform selected in (h).

3. The method of claim 1, wherein (d) further comprises computing $C_0^i$, $C_{-1}^i$, and $C_{+1}^i$ for said each of the pulses of the first plurality of pulses, wherein $C_0^i$ represents a confidence value for the i-th pulse located in the time slot in which it was detected, $C_{-1}^i$ represents a confidence value for the i-th pulse offset one time slot earlier, and $C_{+1}^i$ represents a confidence value for the i-th pulse offset one time slot later.

4. The method of claim 3, wherein (e) further comprises:
   (i) selecting a subset of the plurality of pulses having the lowest confidence values $C_0^i$; and
   (ii) further selecting an offset for said each pulse of the plurality of pulses selected in (i), the offset being $-1$ when $C_{-1}^{Si} > C_{+1}^{Si}$ or $+1$ when $C_{+1}^{Si} >= C_{-1}^{Si}$.

5. The method of claim 4, wherein the subset of the first plurality of pulses selected in (e) further includes S pulses and (f) further comprises generating a set of $2^S$ unique waveforms.

6. The method of claim 3, wherein (e) further comprises selecting a predetermined number of pulses having the lowest confidence values $C_0^i$.

7. The method of claim 3, wherein (e) further comprises selecting a subset of the plurality of pulses having confidence values $C_0^i$ less than a predetermined threshold.

* * * * *